(12) United States Patent
Chikawa et al.

(10) Patent No.: US 6,606,249 B2
(45) Date of Patent: Aug. 12, 2003

(54) CONNECTION STRUCTURE FOR DISPLAY MODULE AND PRINTED SUBSTRATE, SEMICONDUCTOR DEVICE, DISPLAY MODULE, AND ELECTRONIC COMPONENT

(75) Inventors: Yasunori Chikawa, Nara (JP); Kunihiro Satou, Fukuyama (JP); Hiroaki Tomokuni, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/940,466

(22) Filed: Aug. 29, 2001

(65) Prior Publication Data

US 2002/0024802 A1 Feb. 28, 2002

(30) Foreign Application Priority Data

Aug. 29, 2000 (JP) ........................................ 2000-259736

(51) Int. Cl.[7] ................................................ H05K 7/02
(52) U.S. Cl. ...................................... 361/760; 361/801
(58) Field of Search ................................ 361/601, 760, 361/749, 770, 783, 785, 787, 796, 801, 802, 803; 439/66–69, 83, 70–72, 493, 149–152; 206/701, 719; 220/4.02

(56) References Cited

U.S. PATENT DOCUMENTS

| | | | | |
|---|---|---|---|---|
| 4,862,153 A | * | 8/1989 | Nakatani et al. | |
| 5,358,412 A | * | 10/1994 | Maurinus et al. | 439/66 |
| 5,436,744 A | * | 7/1995 | Arledge et al. | |
| 6,068,514 A | * | 5/2000 | Zuin | 439/630 |
| 6,181,278 B1 | * | 1/2001 | Kakimoto et al. | 343/700 |
| 6,307,751 B1 | * | 10/2001 | Bodony et al. | 361/749 |
| 6,358,065 B1 | * | 3/2002 | Terao et al. | 439/67 |

FOREIGN PATENT DOCUMENTS

JP A922760 1/1997

* cited by examiner

*Primary Examiner*—David Martin
*Assistant Examiner*—Thanh S. Phan
(74) *Attorney, Agent, or Firm*—Birch, Stewart, Kolasch & Birch, LLP (57) ABSTRACT

A connection structure for connecting a display module and a printed substrate is provided, which is appropriate for use in mass production of electronic devices such as a cellular phone in which, while a thin mounting is desired, many components have to be mounted on the printed substrate and the display module is required to be mounted in predetermined space on the printed substrate. The liquid crystal module is provided with a pin electrode on an external connection terminal of its COF, and fixed to a housing in a folded state with respective rear surfaces of the COF and a liquid crystal panel facing each other. A holding member for engaging the printed substrate and holding the printed substrate is formed on the housing. When the holding member engages the printed substrate, the liquid crystal module is fixed to the printed substrate, and at the same time, the pin electrode of the COF and a through hole electrode of the printed substrate are electrically connected.

19 Claims, 10 Drawing Sheets

CONNECTION STRUCTURE FOR DISPLAY MODULE AND PRINTED SUBSTRATE, SEMICONDUCTOR DEVICE, DISPLAY MODULE, AND ELECTRONIC COMPONENT

FIELD OF THE INVENTION

The present invention relates to a connection structure for a display module and a printed substrate for connecting the display module, in which a display panel is connected with a semiconductor device formed by bonding and mounting a semiconductor chip on a flexible wiring substrate, to the printed substrate; the semiconductor device and the display module used in the connection structure; and an electronic component formed by connecting the display module with the printed substrate by means of the connection structure. More specifically, the connection structure of the present invention is appropriate for use in electronic devices requiring high-density wiring, such as a cellular phone or a pager unit.

BACKGROUND OF THE INVENTION

Conventionally, in electronic devices such as a cellular phone and a pager unit, a so-called COF (Chip On Film) type semiconductor device, in which a semiconductor chip is bonded and mounted on a flexible wiring substrate, is widely used. On the other hand, a so-called TCP type (Tape Carrier Package), semiconductor device called, in which semiconductor chips are continuously connected on a flexible wiring substrate, is also used in many applications.

The difference between the COF and the TCP lies in a bonded section between an electrode on the semiconductor chip and an electrode on the flexible wiring substrate.

In the TCP, penetrating holes for mounting semiconductor chips are provided beforehand on a tape carrier material, which is a base substance of a flexible wiring substrate. Then, to each of the penetrating holes, a tip portion of a wiring pattern, called an inner lead, is projected like a cantilever, and the inner lead and an electrode of the semiconductor chip are joined.

On the other hand, in the COF, a penetrating hole is not provided on a tape carrier material in a section bonded with a semiconductor chip. That is, in the COF, a wiring pattern in the section bonded with an electrode of the semiconductor chip is backed with the tape carrier material.

When equipped with a liquid crystal driver IC as a semiconductor chip, the COF or the TCP constitutes a liquid crystal driver which drives a liquid crystal panel. Then, the liquid crystal driver and the liquid crystal panel constitute a liquid crystal module, which is provided as a display section in electronic devices such as a cellular phone.

Figure 10:
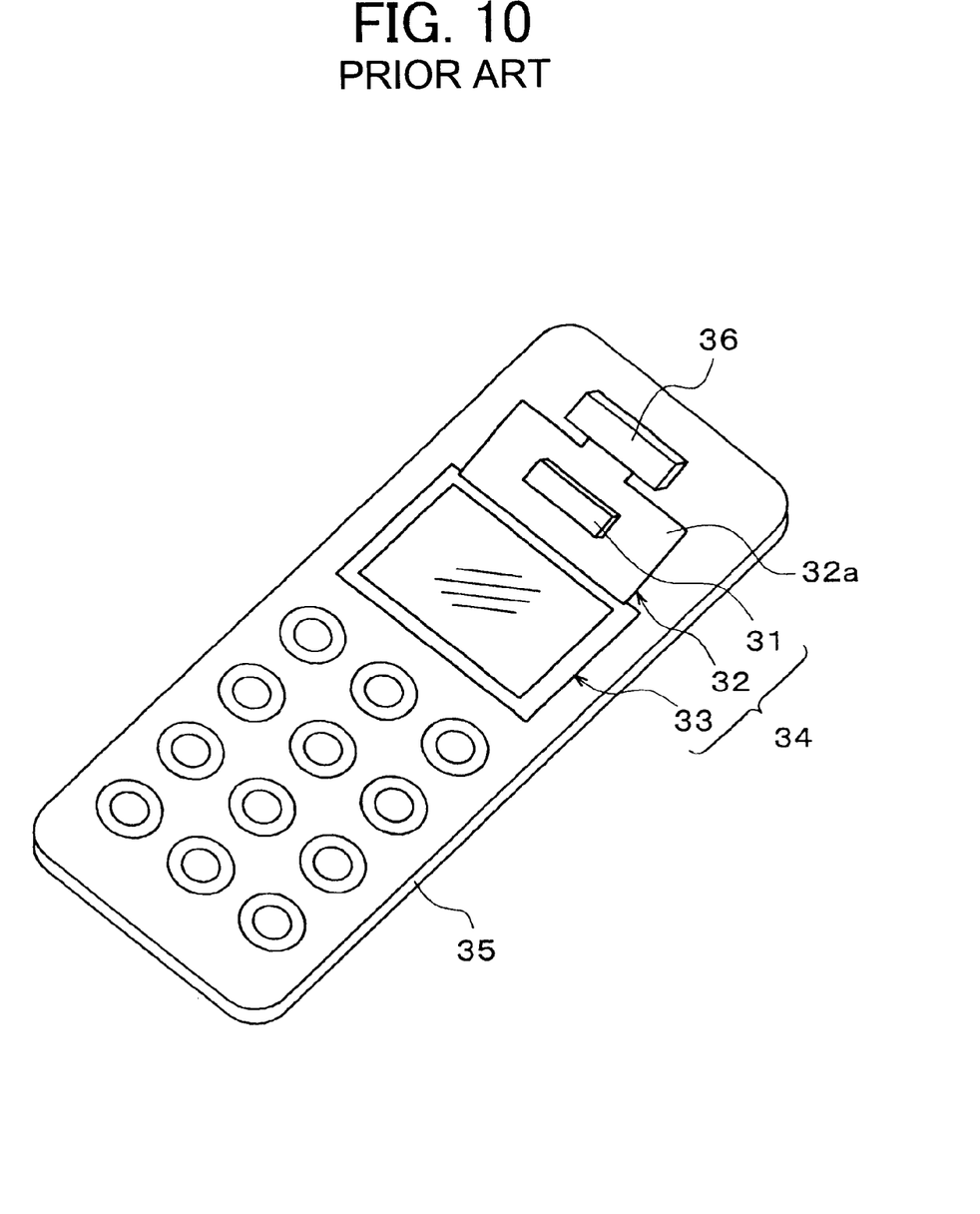
FIG. 10 is a perspective view showing a conventional connection structure for connecting a liquid crystal module with a printed substrate using a connector.

FIG. 10 shows a case in which a COF is used as a liquid crystal driver for driving a liquid crystal panel which constitutes a display section of a cellular phone. In FIG. 10, a COF 32, which constitutes a liquid crystal driver when a semiconductor chip 31 is provided as a liquid crystal driver IC, is connected with a liquid crystal panel 33 so as to form a liquid crystal module 34. The liquid crystal module 34 is attached to a printed substrate 35 which forms an electronic circuit. Here, the COF 32 of the liquid crystal module 34 and the printed substrate 35 are electrically connected via a connector 36.

Conventionally, when connecting a COF (or TCP) of such a liquid crystal module and a printed substrate, a connecting method via a connecter, as mentioned above, and a connecting method using solder are widely used.

Meanwhile, when manufacturing an electronic device using such a liquid crystal module, especially that manufactured in large quantity such as a cellular phone, the following requirements should be satisfied in a process for attaching a liquid crystal module to a printed substrate (a connection process).

(1) Since a product test is conducted after attaching a liquid crystal module to a printed substrate, it should be designed that the liquid crystal module can be easily detached from the printed substrate.

(2) The connection of the liquid crystal module and the printed substrate can be easily automated, without recourse to manual connection.

(3) High reliability should be ensured in the connection of the liquid crystal module and the printed substrate.

However, in the foregoing method using solder to connect a COF of a liquid crystal module with a printed substrate, it is difficult to detach the COF from the printed substrate once they are connected. Therefore, the above requirement (1) cannot be satisfied.

Besides, in the method for connecting the COF of the liquid crystal module with a printed substrate using a connector, as shown in FIG. 10, a terminal section formed at one end of the COF 32 is inserted into the connector 36 for connection. However, since a flexible wiring substrate 32a, which is a base substance of the COF 32, is a soft film, it is difficult to automate the connection and thus manual connection is required. Therefore, the above requirement (2) cannot be satisfied.

Further, when using the connector 36, an actuator is required for pressing the terminal section of the COF 32, resulting in an increase in the number of components required. Besides, due to the adoption of the actuator, the total height of the connection structure on the printed substrate 35 is increased, which is disadvantageous for thin mounting structure.

To solve such problems, Japanese Unexamined Patent Publication No. 9-22760/1997 (Tokukaihei 9-22760, published on Jan. 21, 1997) discloses a method for connecting a liquid crystal module and a printed substrate which allows easy detachment and easy connection process automation. According to the publication, a snap-on method using pawls is adopted.

Figure 11:
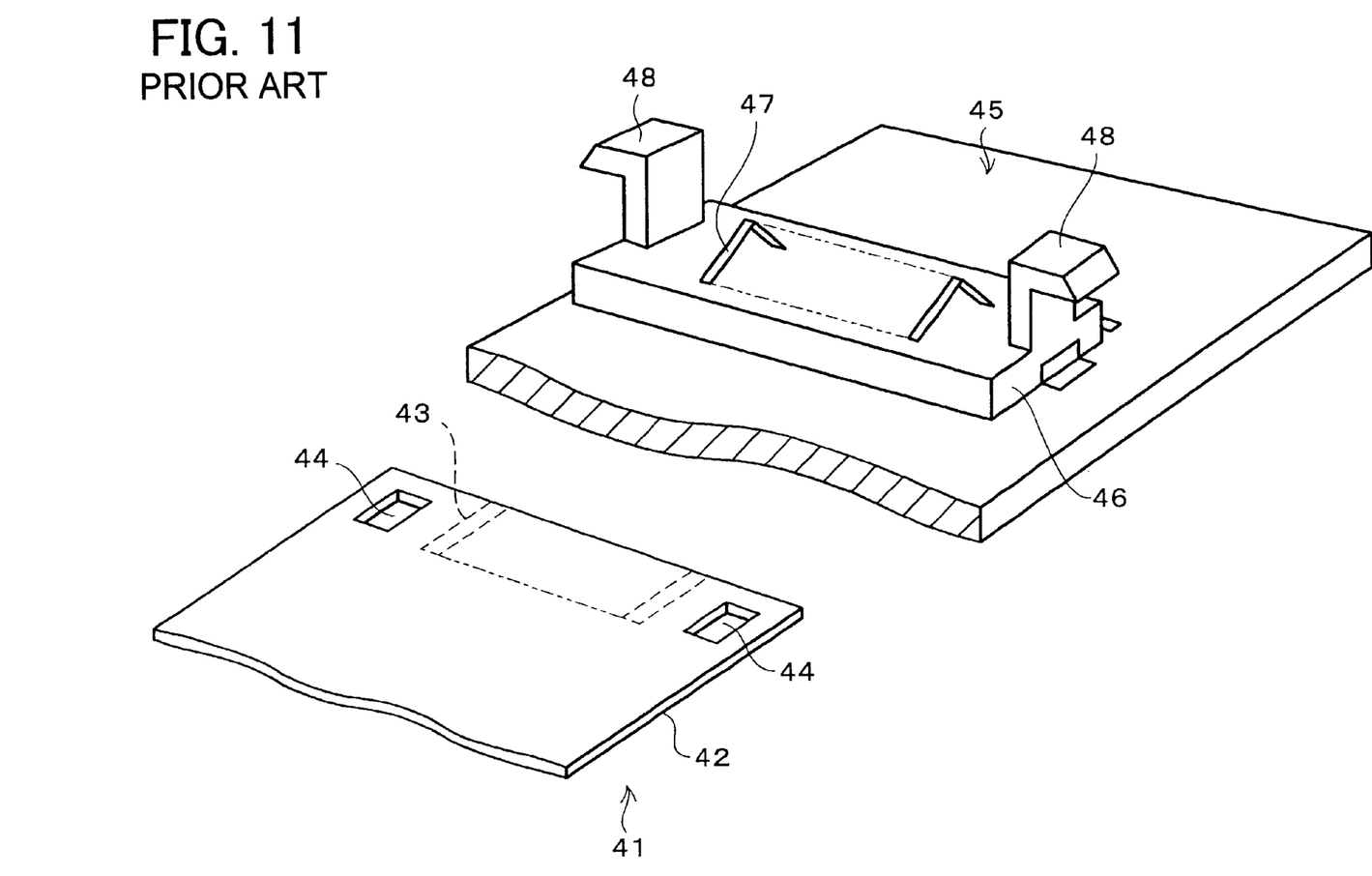
FIG. 11 is an exploded perspective view showing another conventional connection structure for connecting a liquid crystal module with a printed substrate.

In this method, as shown in FIG. 11, engaged holes 44 are provided on a COF 42 of a liquid crystal module 41, near a connection pad 43 for establishing electrical connection with a printed substrate 45. On the printed substrate 45, in a section for fixing the liquid crystal module 41 is mounted a holding base 46, which is provided with a contact 47 corresponding to the connection pad 43 and holding members (pawls) 48 corresponding to the engaged holes 44. By snapping the COF 42 of the liquid crystal module 41 on the printed substrate 45, the corresponding engaged holes 44 and the holding members 48 are engaged so as to fix the COF 42 on the printed substrate 45.

At the same time, the connection pad 43 on the COF 42 and the contact 47 on the printed substrate 45 come into contact, and the connection pad 43 and the contact 47 are electrically connected.

In such a structure, by pressing the COF 42 onto the printed substrate 45 from one direction, the holding members 48 are snapped into the engaged holes 44. At the same time, the connection pad 43 on the COF 42 and the contact 47 on the printed substrate 45 are electrically connected. Therefore, the connecting process can be easily automated.

Meanwhile, such a snap-on method requires design ideas ensuring that the connection pad 43 on the COF 42 and the contact 47 on the printed substrate 45 are connected at the same time when the COF 42 is snapped on the printed substrate 45.

Because, for example, if the contact 47 on the printed substrate 45 is formed in a plane shape, in the same way as the connection pad 43 on the COF 42, the connection pad 43 and the contact 47 are difficult to make contact with each other just by snapping the COF 42 on the printed substrate 45, failing to obtain highly reliable connection. Especially, when the COF 42 is provided with components, the components might obstruct the contact between the connection pad 43 and the contact 47.

In response, in the foregoing publication, the contact 47 provided on the printed substrate 45 is formed as a conductive protruding electrode in a folded shape, and it is structured that the COF 42 is snapped on the printed substrate 45, pressing the contact 47 from above with the plane connection pad 43 on the COF 42.

However, the structure of the foregoing publication has problems as follows.

1) Space for placing the holding base 46 integrated with the holding members 48 and the contact 47 is required on the printed substrate 45, limiting the mounting area allocated for other components mounted on the printed substrate 45.

2) As for the placement of a liquid crystal panel on the printed substrate 45, the liquid crystal panel can be placed in an area except the snap-on section including the holding base 46, or placed above the snap-on section after the COF 42 is snapped on the printed substrate 45 and then folded.

However, in the former case, the liquid crystal module 41 occupies a large area on the printed substrate 45. Therefore, it is difficult to adopt the former case to an electronic device such as a cellular phone which requires to mount many components on predetermined space on the printed substrate 45.

In the latter case, the COF 42 is folded after snapped on the printed substrate 45 so as to fix a liquid crystal panel. Therefore, single-step mounting, that is, connecting the liquid crystal module 41 and the printed substrate 45 mechanically and electrically in a single step, cannot be performed.

Furthermore, in the latter case, the total thickness from a substrate surface of the printed substrate 45 to a display surface of the liquid crystal panel is increased by the thickness of the holding members 48 projecting from the COF 42, which is disadvantageous for thin mounting structure.

SUMMARY OF THE INVENTION

It is therefore the object of the present invention to provide a connection structure for connecting a display module and a printed substrate, by which mechanical and electrical connection between the display module and the printed substrate can be easily established, no limitations are set on the mounting area for other components mounted on the printed substrate, and the total thickness from the printed substrate to the display module can be decreased.

To achieve the foregoing object, a connection structure for a display module and a printed substrate of the present invention is for connecting a display module to a printed substrate, the display module including a display panel connected with a semiconductor device having a semiconductor chip mounted on a flexible wiring substrate, and is characterized in that:

the display module is fixed to a housing member in a folded state with respective rear surfaces of the semiconductor device and the display panel facing each other;

a protruding electrode is formed on the semiconductor device;

the display module is fixed to the printed substrate by means of a holding member (holding strip) attached to the housing member, the holding member supporting the printed substrate in engagement therewith; and the protruding electrode formed on the semiconductor device is in contact with a connection terminal provided on the printed substrate corresponding to the protruding electrode.

According to this structure, the display module which is fixed (held) by the housing member in a folded state is pressed onto the printed substrate from above and snapped on the printed substrate. That is, with this structure, the holding member formed on the housing member engages the printed substrate and fixes the display module to the printed substrate. At the same time, the protruding electrode on the display module comes into contact with the connection terminal of the printed substrate for conduction. Consequently, the display module and the printed substrate can be mechanically and electrically connected in a single step.

Compared with the structure shown in FIG. 11 in which the holding base 46 integrated with the holding members 48 and the contact 47 is placed on the printed substrate 45, in the foregoing structure, there is no need to place a member for fixing the display module on the printed substrate. Therefore, only a contact is required to be provided on the printed substrate so as to come into contact with the protruding electrode on the semiconductor device.

Consequently, since no limitations are set on the mounting area allocated for other components mounted on the printed substrate, the foregoing structure is appropriate for use in electronic devices requiring high-density wiring, such as a cellular phone.

In addition, in the structure shown in FIG. 11, when the liquid crystal panel as the display panel is placed above a connected section connected by the holding members 48, the total thickness from a substrate surface of the printed substrate 45 to a display surface of the liquid crystal panel is increased by the thickness of the holding members 48 projecting from the COF 42. However, in the foregoing structure of the present invention, the total thickness from a substrate surface of the printed substrate to a display surface of the liquid crystal panel can be decreased by the thickness of the holding members, which is advantageous for thin mounting structure.

As for the protruding electrode formed on the foregoing semiconductor device, it is preferable to use a metal pin electrode terminal or a metal spring electrode terminal.

When the protruding electrode is a metal pin electrode terminal, a through hole electrode or a convex electrode is used as a connection terminal of the printed substrate so as to ensure the contact between the both terminals.

When the protruding electrode is a metal spring electrode terminal, even if the attachment height of the display module and the printed substrate varies in some degree, the elasticity of the spring permits the contact between the protruding electrode and the connection terminal of the printed substrate at all times. Therefore, stable conduction between the semiconductor device and the printed substrate can be always obtained.

In the connection structure of the present invention, the display module is attached in a folded state. Thus, it is preferable that the base substance of the flexible wiring substrate of the semiconductor device is made of a polyimide resin material with the thickness of 5 to 75 μm, in consideration of bendability and easiness on handling.

For a fuller understanding of the nature and advantages of the invention, reference should be made to the ensuing detailed description taken in conjunction with the accompanying drawings.

DESCRIPTION OF THE PREFERRED EMBODIMENTS

[First Embodiment]

The following description will explain an embodiment in accordance with the present invention, which relates to a connection structure for connecting a display module with a printed substrate, a semiconductor device, the display module, and an electronic component.

Figure 1:
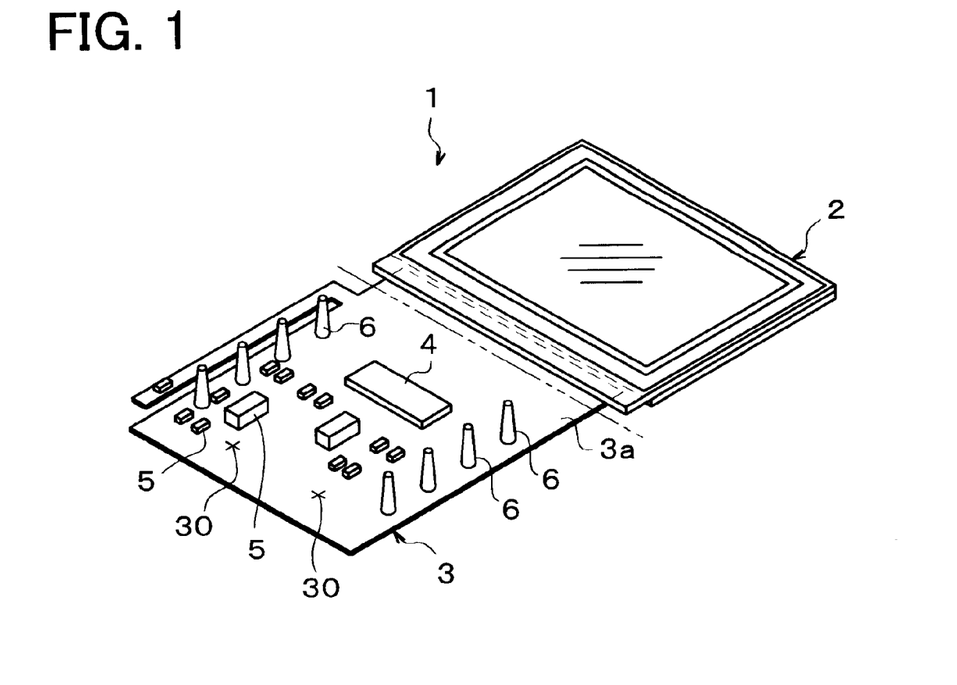
FIG. 1, which shows one embodiment in accordance with the present invention, is a perspective view showing a structure of a liquid crystal module formed by connecting a COF with a liquid crystal panel.

FIG. 1 shows a liquid crystal module (display module) 1, in which a liquid crystal panel (display panel) 2 and a COF 3 as a liquid crystal driver (semiconductor device) are connected. On a flexible wiring substrate 3a, which is a base substance of the COF 3, mounted are a plurality of mounted components 5 including a semiconductor chip 4 which constitutes a liquid crystal driver IC.

Conventionally, in the COF 3, a plane electrode is formed as an external connection terminal, which is the terminal for connecting wiring provided on the flexible wiring substrate 3a with an electrode of a printed substrate which will be described later.

On the other hand, in the present embodiment, pin electrodes (protruding electrodes) 6, made of a conductive material, are formed on the external connection terminals (not shown). The pin electrode 6 is formed by soldering a fine wire cut in a predetermined length on the external connection terminal. The pin electrode 6 is formed in the shape of a virtually conical pin with a flat top.

On the flexible wiring substrate 3a, cross cuts 30 are formed to be used for fixing the liquid crystal module 1 to a housing (housing member) 7 which will be described later. These cuts 30 are formed in an unoccupied area on the flexible wiring substrate 3a on a side opposite to the side to which the liquid crystal panel 2 is connected, so as not to affect the location of the mounted components 5, the semiconductor chip 4, the external connection terminals, and wiring (not shown).

The base substance of the flexible wiring substrate 3a is made of a flexible heat-resistant resin material. It is preferable to use, for example, a polyimide resin as a heat-resistant resin material.

The flexible wiring substrate 3a is difficult to be handled if it is too thin, and difficult to be folded when fixed to the housing 7 if it is too thick. Therefore, it is preferable to set the thickness of the base substance of the flexible wiring substrate 3a at 5 to 75 μm.

The wiring on the flexible wiring substrate 3a may be bonded on the base substance with an adhesive, or may be fixed by means of the casting method or the additive method, not using an adhesive. Here, the casting method is a method for forming wiring by dropping polyimide on a Cu foil or coating a Cu foil with polyimide. The additive method is a method for forming Cu wiring on a base substance made of polyimide by means of evaporation, partial plating, or etching.

Figure 2:
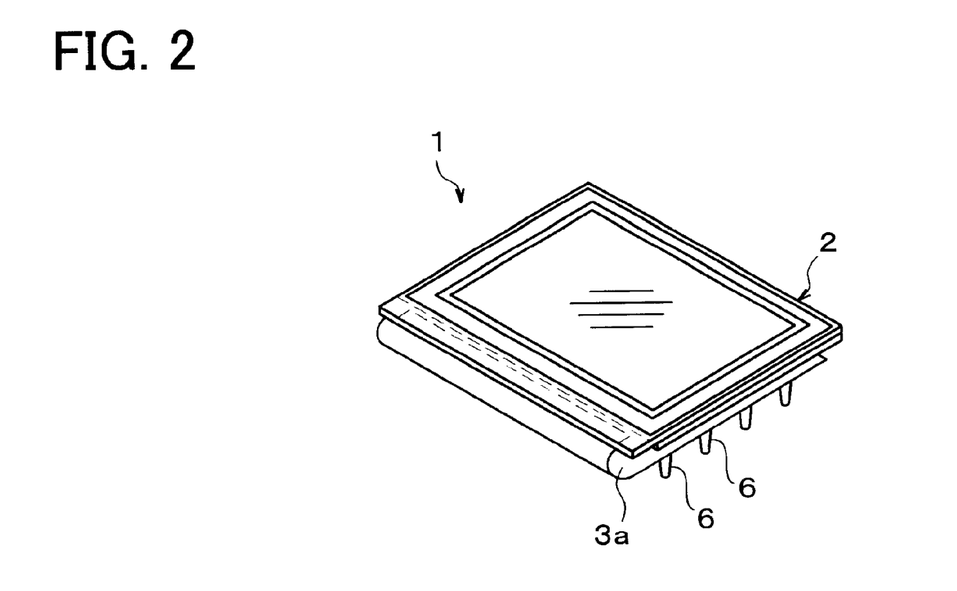
FIG. 2 is a perspective view showing a state where the liquid crystal module in FIG. 1 is folded.

When attaching such a liquid crystal module 1 to a printed substrate 15 (see FIG. 4), as shown in FIG. 2, the liquid crystal module 1 is folded in the proximity of the section where the COF 3 is connected to the liquid crystal panel 2 (along the two-dot chain line in FIG. 1). Here, the liquid crystal module 1 is folded with respective rear surfaces of the COF 3 and the liquid crystal panel 2 facing each other. Then, the liquid crystal module 1, kept being folded, is fixed to the housing 7 shown in FIGS. 3(a) and 3(b).

Figure 3:
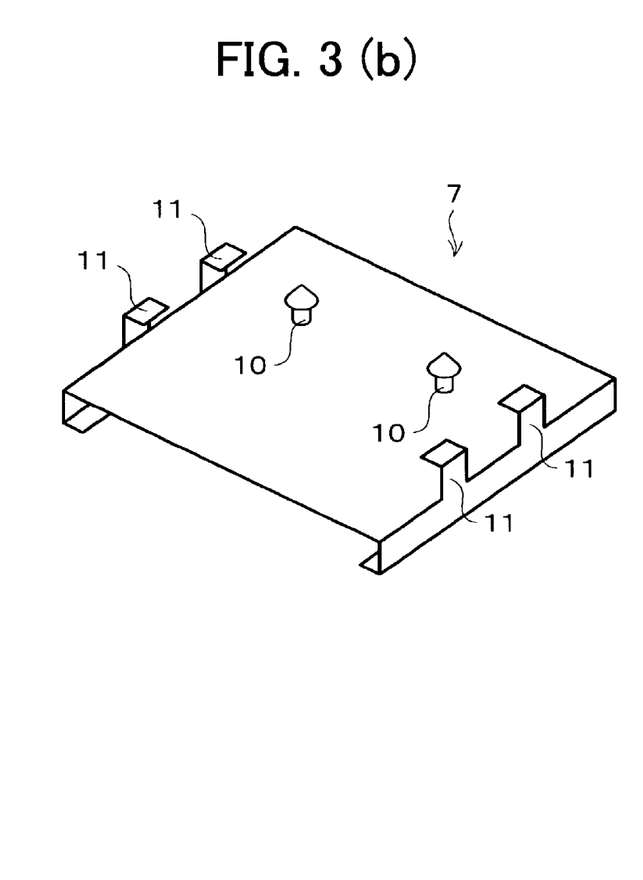
FIGS. 3(a) and 3(b) are perspective views showing a housing for holding the liquid crystal module in FIG. 1 in a folded state.

The housing 7 includes a rectangle holding plate 8 formed so as to fit the shape of the liquid crystal panel 2, on which the liquid crystal panel 2 is placed. On an upper face of the holding plate 8, on its three sides except the side along which the liquid crystal panel 2 and the COF 3 are connected, a three-sided frame 9 is formed so as to hold the perimeter of the liquid crystal panel 2. With the structure that the perimeter of the liquid crystal panel 2 is held by the frame 9, the liquid crystal panel 2 of the liquid crystal module 1 is fixed to the housing 7.

Meanwhile, on a rear surface of the holding plate 8, large-head protrusions 10 are formed so as to hold the folded COF 3. These protrusions 10 are formed at the positions corresponding to the cuts 30 formed on the flexible wiring substrate 3a shown in FIG. 1. These protrusions 10 are inserted into the cuts 30 on the COF 3 from the rear surface of the COF 3, so as to fix the COF 3 of the liquid crystal module 1 to the housing 7.

Figure 5:
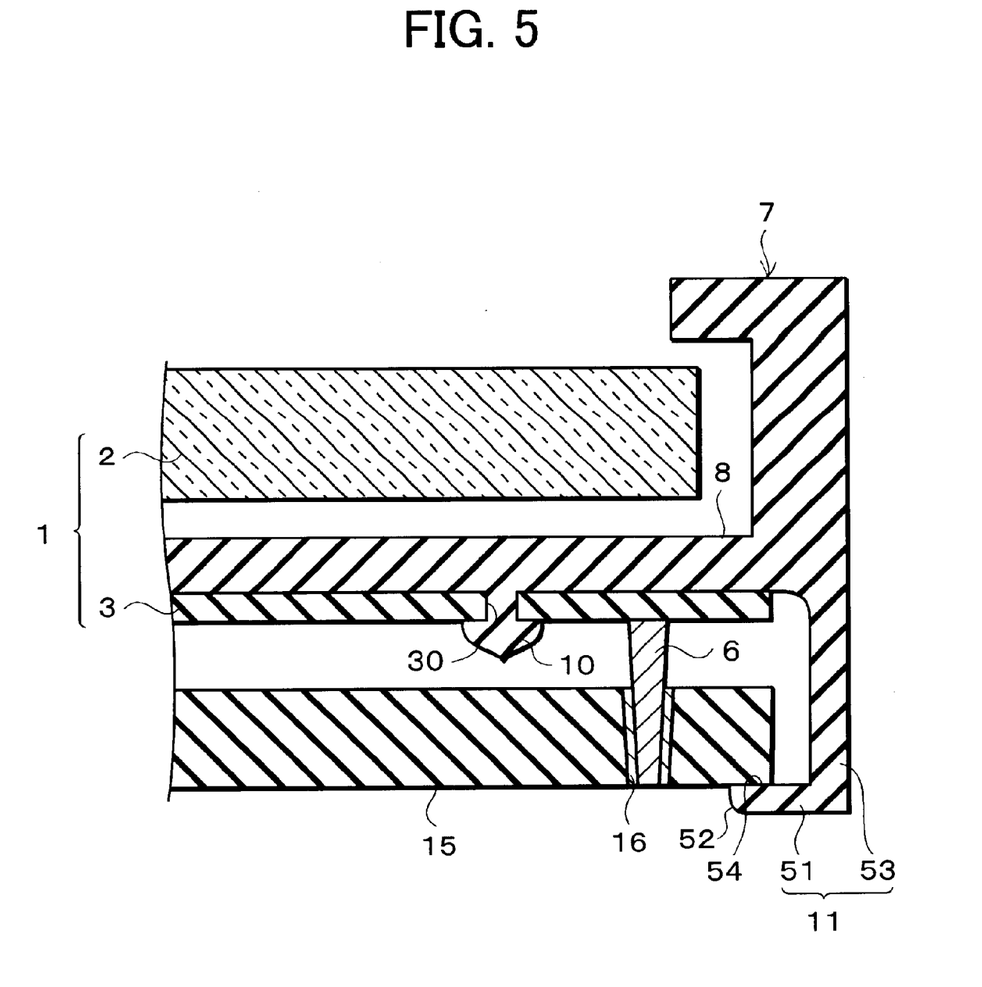
FIG. 5 is a cross-sectional view in a direction vertical to a printed substrate, showing the connection structure for connecting the liquid crystal module in FIG. 1 with a printed substrate.

Further, on each of two opposing sides on the rear surface of the housing 7, holding members 11 are provided. These holding members 11 have flexibility and elasticity, and as shown in FIG. 5, they are formed in a shape of a letter L, with its pawl sections 51 formed at the tip of the holding members 11 on one side and the pawl sections 51 of the holding members 11 on the other side facing one another. Further, in the pawl section 51, a sloped section 52 is formed by tilting an external end of the pawl section 51 so as to narrow a tip of the pawl section 51 facing the pawl section 51 on the other side.

When the liquid crystal module 1, fixed to the housing 7, is pressed onto the printed substrate 15 from above, first, the upper face of the liquid crystal module 1 comes into contact with the sloped section 52 of the holding member 11.

When the liquid crystal module 1 is further pressed, the pawl section 51 is deformed inward and longer side 53 of the L-shaped holding member 11 is once spread outward, pressed by the liquid crystal module 1. As the liquid crystal module 1 is kept pressed, the pawl section 51, failing to withstand the deformation any more, engages the bottom face of the liquid crystal module 1. Then, the longer side 53 engages the fringe portion of the printed substrate 15 and holds the printed substrate 15. Here, inner surface 54 of the pawl section 51, formed on an opposite side of the sloped section 52, engages the printed substrate 15 and holds the printed substrate 15.

As for the material for the housing 7, various insulating materials can be used. However, since the holding members 11 are once spread outward so as to engage the printed substrate 15, it is preferable that the housing 7 is made of a resin material with flexibility and elasticity.

In this manner, the liquid crystal module 1 is fixed to the housing 7 in a folded state, and completed as a final structure to be attached to the printed substrate 15. A component formed by connecting the liquid crystal module 1 with the printed substrate 15 by means of the housing 7 is the electronic component in accordance with the present embodiment.

Figure 4:
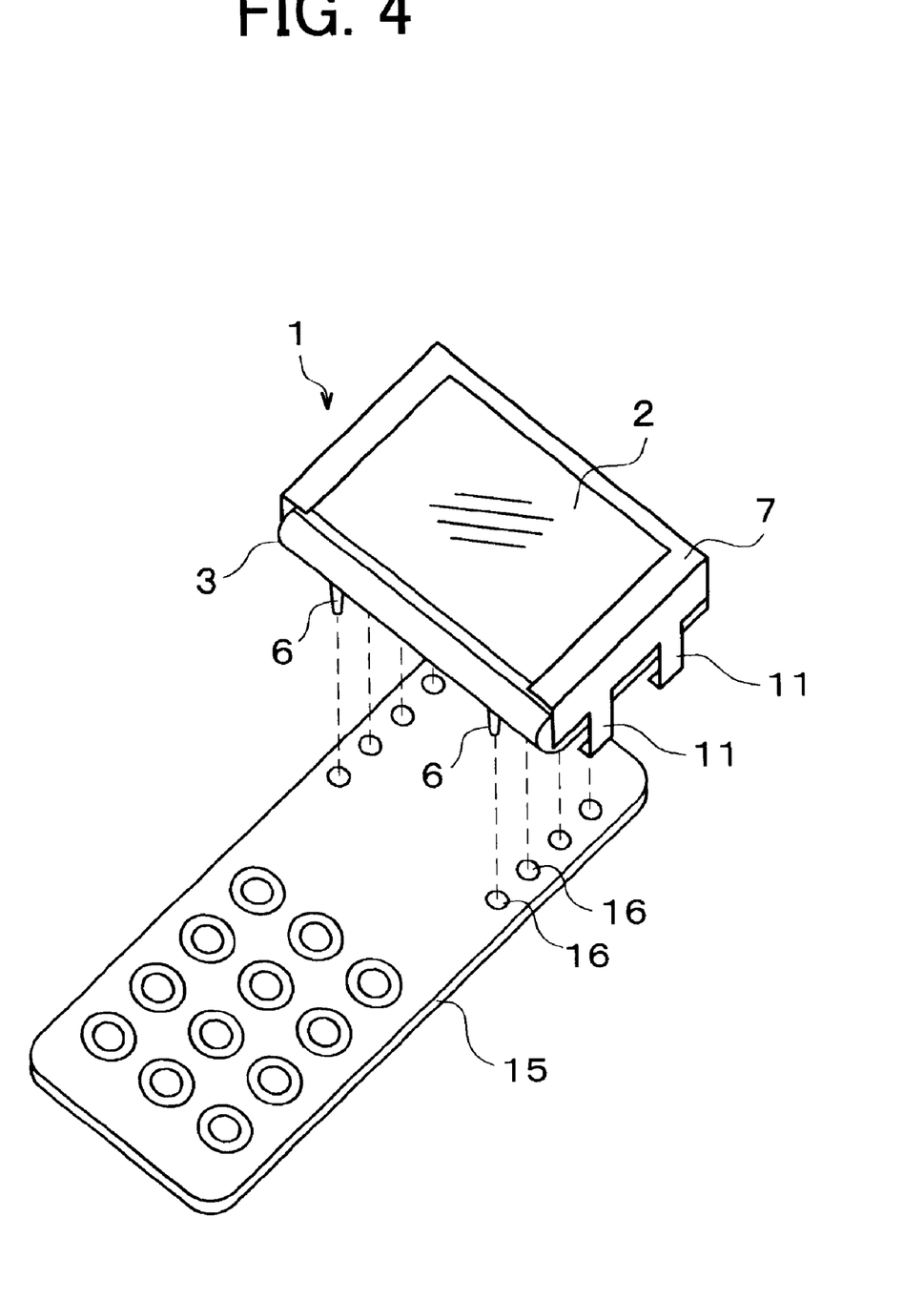
FIG. 4 is an exploded perspective view showing a connection structure for connecting the liquid crystal module in FIG. 1 with a printed substrate.

Meanwhile, in the printed substrate 15, to which the liquid crystal module 1 fixed to the housing 7 is attached, through hole electrodes (connection terminals) 16 are provided as shown in FIG. 4. These through hole electrodes 16 are formed at the positions corresponding to the pin electrodes 6 on the COF 3 so as to make contact with the pin electrodes 6.

The liquid crystal module 1 and the printed substrate 15 are attached with the positions of the through hole electrodes 16 matched to those of the corresponding pin electrodes 6 on the COF 3. That is, in this state, the liquid crystal module 1 fixed to the housing 7 is pressed onto the printed substrate 15 from above, so that the holding members 11 attached to the housing 7 engage the fringe portions of the printed substrate 15.

In this manner, the holding members 11 formed on the two opposing sides of the housing 7 engage the fringe portions (the bottom face) of the printed substrate 15, in such a manner that the holding members 11 hold the printed substrate 15 from the sides. That is, the pawl sections 51 at the tip of the holding members 11 of the housing 7 engage the rear surface of the printed substrate 15 so as to elastically join the printed substrate 15 to the housing 7. As a result, the liquid crystal module 1 is mechanically connected to the printed substrate 15.

At the same time, the pin electrodes 6 on the COF 3 are inserted into the through hole electrodes 16 in the printed substrate 15. With this arrangement, the printed substrate 15 and the COF 3, that is, the printed substrate 15 and the liquid crystal module 1 are connected also electrically. Consequently, the liquid crystal module 1 and the printed substrate 15 are mechanically and electrically connected in a single step.

FIG. 5 is a cross-sectional view showing a connected section of the liquid crystal module 1 and the printed substrate 15. As shown in FIG. 5, the through hole electrode 16 formed in the printed substrate 15 is shaped so as to fit the shape of the virtually conical pin electrode 6. That is, the through hole electrode 16 is formed as a penetration hole having a slightly inclined surface. On the side face of the hole, through hole plating is given so as to form an electrode. Thus, just by inserting the pin electrode 6 into the through hole electrode 16, the liquid crystal module 1 and the printed substrate 15 can be securely conducted.

The holding members 11 of the housing 7 are formed so as to engage the bottom face (the rear surface) of the printed substrate 15. Therefore, the total thickness from a substrate surface of the printed substrate 15 to a display surface of the liquid crystal panel 2 can be decreased by the thickness of the holding members 11, which is advantageous for thin mounting structure.

[Second Embodiment]

Figure 6:
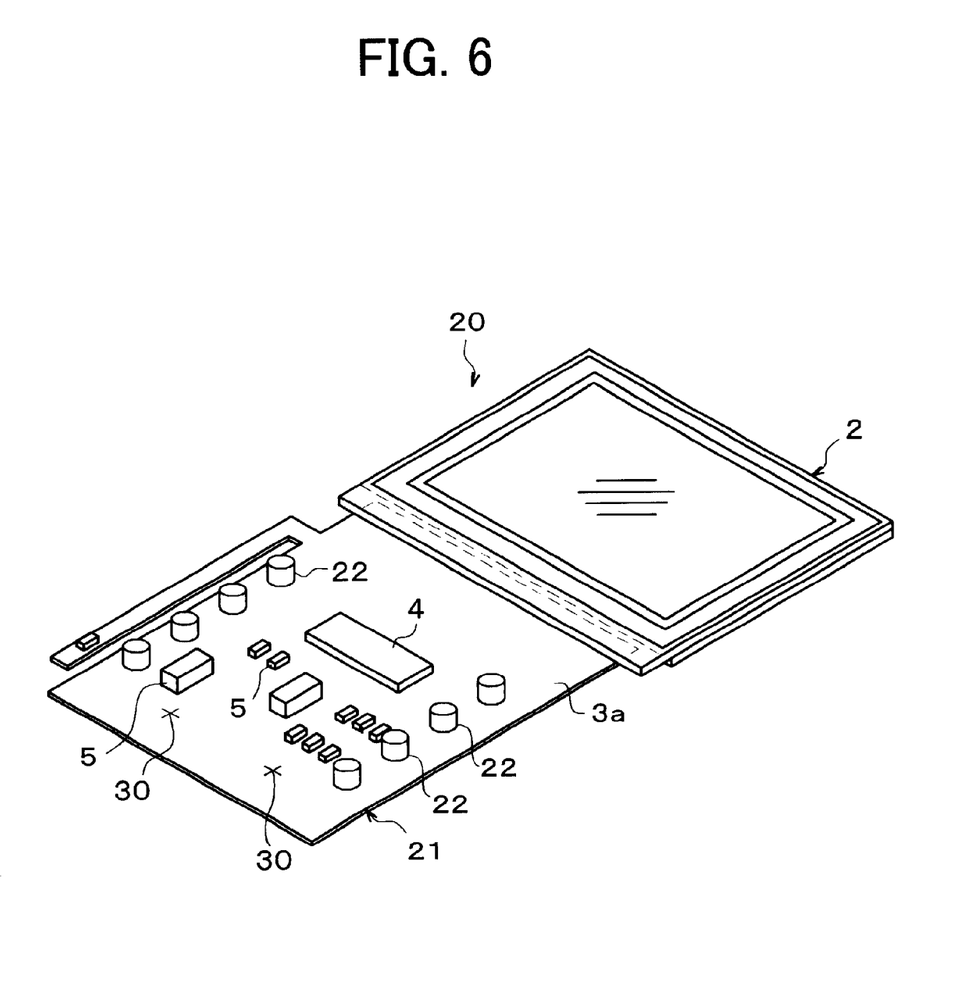
FIG. 6, which shows another embodiment in accordance with the present invention, is a perspective view showing a structure of a liquid crystal module formed by connecting a COF with a liquid crystal panel.
Figure 7:
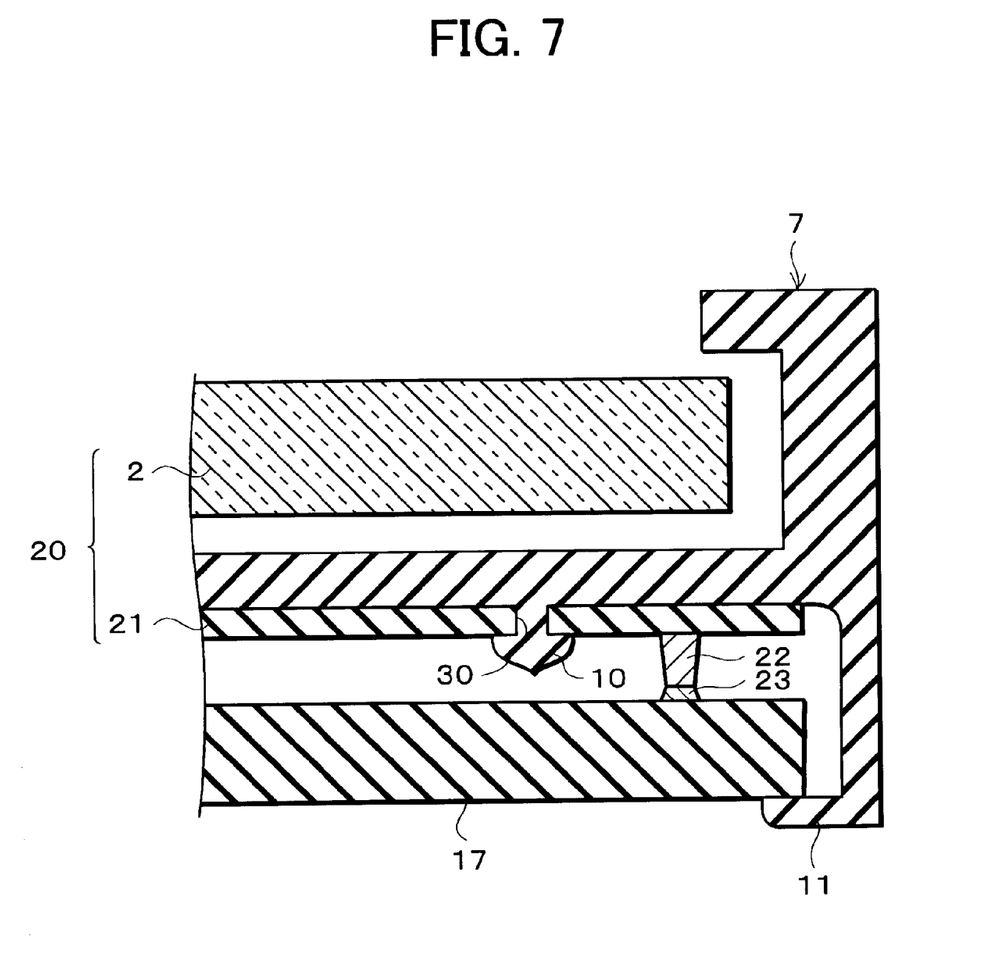
FIG. 7 is a cross-sectional view in a direction vertical to a printed substrate, showing the connection structure for connecting the liquid crystal module in FIG. 6 with a printed substrate.

Referring to FIGS. 6 and 7, the following description will explain another embodiment in accordance with the present invention, which relates to a connection structure for connecting a display module with a printed substrate, a semiconductor device, the display module, and an electronic component. The members having the same structure (function) as those in the first embodiment will be designated by the same reference numerals and their description will be omitted.

FIG. 6 shows a liquid crystal module (display module) 20 of the present embodiment. The liquid crystal module 20 has a COF 21 instead of the COF 3 in the structure of the liquid crystal module 1. The COF 21 has convex electrodes 22 instead of the pin electrodes 6 in the structure of the COF 3.

That is, the liquid crystal module 1 described in the first embodiment (see FIG. 1) and the liquid crystal module 20 are identical in that a plurality of mounted components 5 including a semiconductor chip 4, which constitutes a liquid crystal driver IC, are mounted on the flexible wiring substrate 3a, a base substance of the COF 21.

Meanwhile, in the liquid crystal module 1, the pin electrodes 6 are formed on the external connection terminals of the COF 3. On the other hand, in the liquid crystal module 20, protruding convex electrodes (protruding electrodes) 22, made of a conductive material, are formed on external connection terminals of the COF 21. The convex electrodes 22 are formed highest among various components mounted on the flexible wiring substrate 3a.

A printed substrate 17, to which the liquid crystal module 20 is attached, is provided with flat-head connection terminals 23 instead of the through hole electrodes 16 in the structure of the printed substrate 15 shown in FIG. 4. As shown in FIG. 7, the connection terminal 23 is formed at the position corresponding to the convex electrode 22, so as to make contact with the convex electrode 22.

FIG. 7 is a cross-sectional view showing a connected section of the liquid crystal module 20 and the printed substrate 17. As shown in FIG. 7, the liquid crystal module 20 is mechanically connected to the printed substrate 17 by means of the holding member 11 of the housing 7. In this state, the connection terminal 23 formed on the printed substrate 17 and the convex electrode 22 on the COF 21 are securely in contact with each other and electrically connected.

As for the method for forming the conductive convex electrode 22 on the COF 21, the following methods can be adopted: a method for forming the convex electrode 22 selectively on the external connection terminal of the COF 21 by means of the electric plating method when forming the COF 21; a method for printing conductive paste on the external connection terminal of the COF 21 by means of the printing method or the like; a method for forming a gold ball or a solder ball on the external connection terminal of the COF 21 by means of the wire bonding method or the like, etc.

[Third Embodiment]

Figure 8:
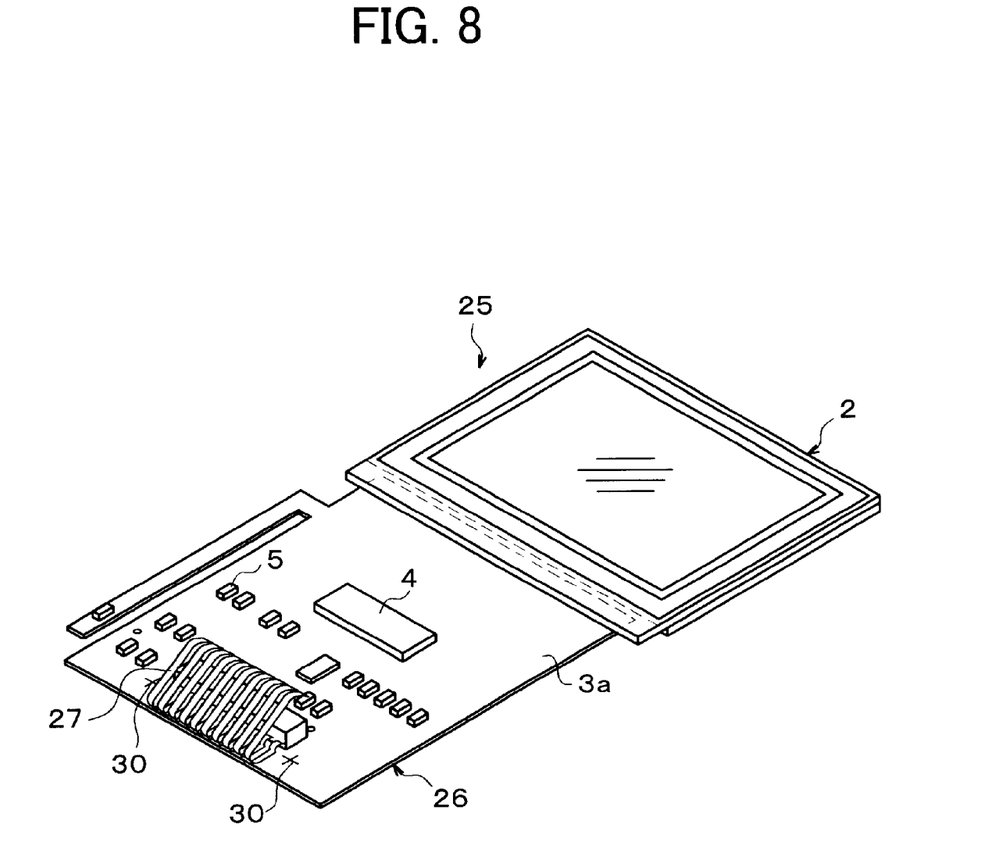
FIG. 8, which shows still another embodiment in accordance with the present invention, is a perspective view showing a structure of a liquid crystal module formed by connecting a COF with a liquid crystal panel.

Referring to FIG. 8, the following description will explain still another embodiment in accordance with the present invention, which relates to a connection structure for connecting a display module with a printed substrate, a semiconductor device, the display module, and an electronic component. The members having the same structure (function) as those in the first embodiment will be designated by the same reference numerals and their description will be omitted.

FIG. 8 shows a liquid crystal module (display module) 25 of the present embodiment. The liquid crystal module 25 has a COF 26 instead of the COF 3 in the structure of the liquid crystal module 1. The COF 26 has a spring electrode 27 instead of the pin electrodes 6 in the structure of the COF 3.

That is, the liquid crystal module 1 described in the first embodiment (see FIG. 1) and the liquid crystal module 25 are identical in that a plurality of mounted components 5 including a semiconductor chip 4, which constitutes a liquid crystal driver IC, are mounted on the flexible wiring substrate 3a, a base substance of the COF 26.

Meanwhile, in the liquid crystal module 1, the pin electrodes 6 are formed on the external connection terminals of the COF 3. On the other hand, in the liquid crystal module 25, an external connection terminal of the COF 26 is formed in the proximity of the side opposite to the side to which the liquid crystal panel 2 is connected. Further, the spring electrode (protruding electrode) 27, made of a conductive material, is formed on the external connection terminal.

Figure 9:
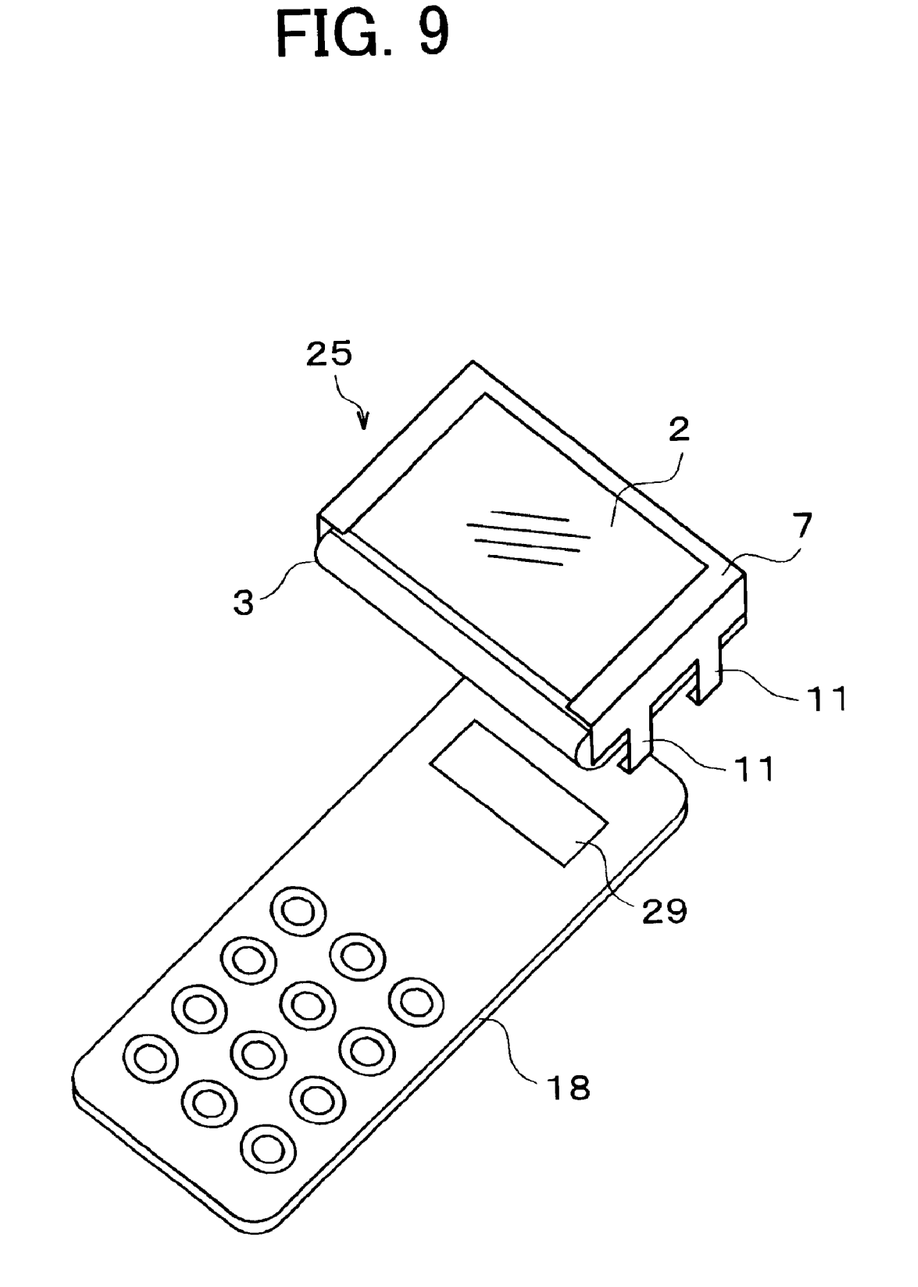
FIG. 9 is an exploded perspective view showing a connection structure for connecting the liquid crystal module in FIG. 8 with a printed substrate.

Therefore, as shown in FIG. 9, on a printed substrate 18 to which the liquid crystal module 25 is attached, a plane connection terminal 29, making contact with the spring electrode 27, is formed at the position corresponding to the spring electrode 27. The printed substrate 18 is different from the printed substrate 15 (see FIG. 4) in that, instead of the through hole electrodes 16, the plane connection terminal 29 is provided.

The connection between the liquid crystal module 25 and the printed substrate 18 as structured above is also obtained with reliability, in the same way as the connection between the liquid crystal module 1 and the printed substrate 15 in the first embodiment, and the connection between the liquid crystal module 20 and the printed substrate 17 in the second embodiment.

That is, by pressing the liquid crystal module 25 fixed to the housing 7 in a folded state onto the printed substrate 18 from above, the connection terminal 29 formed on the printed substrate 18 and the spring electrode 27 on the COF 26 come into contact with each other. With this structure, electric conduction between the connection terminal 29 and the spring electrode 27 can be obtained. Besides, at this time, the liquid crystal module 25 can be mechanically connected to the printed substrate 18 securely by means of the holding members 11 of the housing 7.

Especially, when the spring electrode 27 is used as a protruding electrode on the COF 26, the spring electrode 27 has the following advantage. That is, even if the attachment height of the liquid crystal module 25 and the printed substrate 18 varies in some degree, the elasticity of the spring permits the contact between the spring electrode 27 on the COF 26 and the connection terminal 29 on the printed substrate 18 to be maintained. Therefore, a stable conduction between the COF 26 and the printed substrate 18 is always obtained. Since the spring electrode 27 has been commercially available, the description on the spring electrode 27 such as the explanation of its forming method will be omitted here.

As has been discussed, a connection structure in accordance with the present invention is a connection structure for connecting a liquid crystal module to a printed substrate, the liquid crystal module including a liquid crystal panel connected with a semiconductor device having a semiconductor chip mounted on a flexible wiring substrate, wherein:

the liquid crystal module is fixed to a housing member in a folded state with respective rear surfaces of the semiconductor device and the display panel facing each other;

a protruding electrode is formed on an external connection terminal of the semiconductor device of the liquid crystal module;

the liquid crystal module is fixed to the printed substrate by means of a holding member attached to the housing member, the holding member supporting the printed substrate in engagement therewith; and the protruding electrode formed on the semiconductor device is in contact with a connection terminal provided on the printed substrate corresponding to the protruding electrode.

According to this structure, by pressing the liquid crystal module which is held by the housing member in a folded state onto the printed substrate from above and snapping the liquid crystal module on the printed substrate, the holding member formed on the housing member engages the printed substrate and fixes the liquid crystal module to the printed substrate, and at the same time, the protruding electrode on the liquid crystal module comes into contact with the connection terminal of the printed substrate for conduction. That is, the liquid crystal module and the printed substrate can be mechanically and electrically connected in a single step.

Compared with the structure shown in FIG. 11 in which the holding base 46 integrated with the holding members 48 and the contact 47 is placed on the printed substrate 45, in the foregoing structure, only a contact is required to be provided on the printed substrate so as to come into contact with the protruding electrode on the semiconductor device, setting no limitations on the mounting area allocated for other components mounted on the printed substrate.

Further, while the liquid crystal module and the printed substrate can be mechanically and electrically connected in a single step, the liquid crystal panel in the liquid crystal module is placed above a connected section connected by the holding members, and thus the liquid crystal module does not require a large area when placed on the printed substrate. Therefore, the foregoing structure is appropriate for use in electronic devices such as a cellular phone.

In addition, in the structure shown in FIG. 11, when the liquid crystal panel is placed above a connected section connected by the holding members 48, the total thickness from a substrate surface of the printed substrate 45 to a display surface of the liquid crystal panel is increased by the thickness of the holding members 48 projecting from the COF 42. However, in the foregoing structure of the present invention, since the holding members of the housing are formed so as to engage the rear surface of the printed substrate, the total thickness from a substrate surface of the printed substrate to a display surface of the liquid crystal panel can be decreased by the thickness of the holding members, which is advantageous for thin mounting structure.

As for the protruding electrode formed on the external connection terminal in the foregoing semiconductor device, it is preferable to use a metal pin electrode terminal or a metal spring electrode terminal. When the protruding electrode is a metal pin electrode terminal, a through hole electrode is used as a connection terminal of the printed substrate so as to ensure the contact between the both terminals. When the protruding electrode is a metal spring electrode terminal, even if the attachment height of the liquid crystal module and the printed substrate varies in some degree, the elasticity of the spring permits a stable conduction to be always obtained.

In the connection structure of the present invention, since the liquid crystal module is attached in a folded state, it is preferable that the base substance of the flexible wiring substrate of the semiconductor device which constitutes the liquid crystal module is made of a polyimide resin material with the thickness of 5 to 75 μm, in consideration of bendability and easiness on handling.

In the foregoing first through third embodiments, a COF is taken as an example of a semiconductor device which works as a liquid crystal driver for a display device. It is needless to say that the semiconductor device used for the connection structure for a display device and a printed substrate of the present invention may be a TCP, the semiconductor device described earlier in which a flexible wiring substrate is formed like a long tape.

In the foregoing first through third embodiments, a liquid crystal panel is taken as an example of a display panel in a display module. The display panel of the present invention may be the one which constitutes a display section in an electronic device. For example, an organic EL (Electro Luminescence) panel, a PDP (Plasma Display Panel), etc., may be adopted as a display panel.

The top of the pin electrode 6 is not limited to a flat face, but may also be hemispheric, protruding, spherical, or the like.

The connection structure of the present invention may be expressed as a connection structure for connecting a display module to a printed substrate, the display module being formed by connecting a display panel with a semiconductor device, the connection structure being arranged so as to include:

a protruding electrode provided on the semiconductor device so as to establish electrical connection with a substrate electrode formed on the printed substrate;

a housing member for holding the display module in a state where respective rear surfaces of the semiconductor device and the display panel face each other; and a holding member attached to the housing member, for connecting the display module to the printed substrate, the holding member supporting the printed substrate in engagement therewith by holding the fringe portion of the printed substrate.

The foregoing connection structure of the present invention (the present connection structure) relates to the connection between a display module for displaying images and a printed substrate for controlling the display module, and is applied, for example, to electronic devices such as a cellular phone.

Here, the display module is made up of a display panel such as a liquid crystal panel, an organic EL panel, etc., and a semiconductor device for driving the display panel. The semiconductor device includes a semiconductor chip, which is a center of the semiconductor device, various components for supporting the element, and a substrate for mounting the semiconductor chip and the components.

The printed substrate includes an electronic circuit in an electronic device, and it controls the display module using the circuit.

The present connection structure is provided so as to establish satisfactory mechanical and electrical connection between the display module and the printed substrate.

As described above, in the present connection structure, the semiconductor device in the display module has a protruding electrode on its surface (electrode surface). This electrode is provided so as to establish electrical connection with the substrate electrode formed on the printed substrate.

In the present connection structure, the display module is arranged so as to be in a state where respective rear surfaces of the semiconductor device and the display panel face each other. That is, the display module is folded so that the display surface of the display panel and the electrode surface of the semiconductor device face in opposite directions.

Therefore, in the present connection structure, the semiconductor device (display module) and the printed substrate are electrically connected at the rear of the display panel (under the display panel: between the display panel and the printed substrate).

The present connection structure is arranged so as to firmly fix the display module by surrounding (holding) the display module in a folded state by means of the housing member, to maintain the folded state of the display module.

Further, in the present connection structure, the housing member is provided with a holding member. This holding member is provided for fixing (mechanically connecting) the display module, which is held by the housing member, to the printed substrate, by holding (grasping) the fringe portion of the printed substrate.

With this arrangement, in the present connection structure, mechanical and electrical connection between the display module and the printed substrate can be easily established just by matching the position of the protruding electrode to the position of the substrate electrode and by fixing the housing member to the printed substrate by means of the holding member.

In the present connection structure, only a substrate electrode is required to be provided on the printed substrate. Therefore, this structure can avoid limiting space allocated for other components mounted on the printed substrate.

In the present connection structure, the display module is held in a folded state, and the holding member is provided to the housing member surrounding the display module. Thus, the housing member, which includes the display module and the holding member, occupies a small area on the printed substrate. Consequently, the present connection structure can be appropriately adopted as a structure for small electronic devices such as a cellular phone.

In the present connection structure, the holding member of the housing member is arranged so as to grasp the fringe portion of the printed substrate. Thus, the total thickness from the display module to the printed substrate can be decreased, compared with the structure in which the holding member is projected from the surface of the printed substrate. As a result, the implementation of a thin electronic device is facilitated.

In the present connection structure, the display module is arranged so as to be in a state where respective rear surfaces of the semiconductor device and the display panel face each other (in a folded state). Therefore, it is desirable that the substrate of the semiconductor device is flexible. Since the semiconductor device can be easily deformed with this arrangement, the display module can be folded easily.

An electronic component of the present invention may also be expressed as an electronic component formed by connecting a display module to a printed substrate, the display module being formed by connecting a display panel with a semiconductor device, wherein the electronic component includes a housing member for holding the display module in a state where respective rear surfaces of the semiconductor device and the display panel face each other;

the semiconductor device includes a protruding electrode for establishing electrical connection with a substrate electrode formed on the printed substrate; and the housing member includes a holding member for connecting the display module to the printed substrate, the holding member supporting the printed substrate in engagement therewith by holding the fringe portion of the printed substrate.

The display module of the present invention may also be expressed as a display module which is arranged so as to include a semiconductor device and a display panel, and connected to a printed substrate so as to constitute an electronic component, wherein the display module is set to be held by a housing member in a state where respective rear surfaces of the semiconductor device and the display panel face each other;

the semiconductor device includes a protruding electrode for establishing electrical connection with a substrate electrode formed on the printed substrate; and the housing member includes a holding member for connecting the display module to the printed substrate, the holding member supporting the printed substrate in engagement therewith by holding the fringe portion of the printed substrate.

The display module of the present invention may also be expressed as a display module which forms a connection structure with a printed substrate having a connection terminal, which is arranged so as to include:

a semiconductor device which includes a flexible wiring substrate, a semiconductor chip mounted on the flexible wiring substrate, and a protruding electrode which establishes electrical connection with the connection terminal of the printed substrate; and a display panel connected to the semiconductor device, wherein the display module is fixed to a housing member having attached thereto a holding member for fixing the printed substrate, in a folded state with respective rear surfaces of the semiconductor device and the display panel facing each other.

The electronic component of the present invention may also be expressed as an electronic component which is arranged so as to include:

a printed substrate having a connection terminal;

a display module which includes a semiconductor device and a display panel, the semiconductor device including a flexible wiring substrate, a semiconductor chip mounted on the flexible wiring substrate, and a protruding electrode which establishes electrical connection with the connection terminal of the printed substrate; the display panel being connected to the semiconductor device; and a housing member for fixing the display module to the printed substrate by means of a holding member attached to the housing member, in a folded state with respective rear surfaces of the semiconductor device and the display panel facing each other, the holding member supporting the printed substrate in engagement therewith.

As for the method for forming wiring on the flexible wiring substrate 3a, the wiring may be bonded on a base substance with an adhesive, or may be fixed by other methods which do not use an adhesive, such as the casting method which forms wiring by dropping polyimide on a Cu foil or coating a Cu foil with polyimide, or the additive method which forms Cu wiring on a base substance made of polyimide by means of evaporation, partial plating, or etching.

In the structure of Japanese Unexamined Patent Publication No. 9-22760/1997, as shown in FIG. 11, there is no construction for holding a liquid crystal panel. Thus, it is required to add a member for holding a liquid crystal panel. Therefore, in this structure, the total thickness from a substrate surface of a printed substrate to a display surface of a liquid crystal panel is increased by the thickness of the holding member, compared with the structure of the present invention.

The liquid crystal module 1 and the printed substrate 15 are attached in such a manner that the liquid crystal module 1 fixed to the housing 7 is pressed onto the printed substrate 15 from above with the positions of the through hole electrodes 16 matched to those of the corresponding pin electrodes 6 on the COF 3, so that the holding members 11 attached to the housing 7 engage the fringe portions of the printed substrate 15. The holding members 11 formed on the two opposing sides of the housing 7 engage the bottom face of the printed substrate 15, in such a manner that the holding members 11 hold the printed substrate 15 from the sides, and as a result, the liquid crystal module 1 is mechanically connected to the printed substrate 15. At the same time, the pin electrodes 6 on the COF 3 are inserted into the through hole electrodes 16 in the printed substrate 15, and the printed substrate 15 and the COF 3, that is, the printed substrate 15 and the liquid crystal module 1 are connected also electrically. In other words, the liquid crystal module 1 and the printed substrate 15 are mechanically and electrically connected in a single step.

In the printed substrate 17 to which the liquid crystal module 20 is attached, as shown in FIG. 7, the flat-head connection terminal 23 is provided instead of the through hole electrode 16, at the position corresponding to the convex electrode 22, so as to make contact with the convex electrode 22. FIG. 7 is a cross-sectional view showing a connected section of the liquid crystal module 20 and the printed substrate 17. As shown in FIG. 7, in a state where the liquid crystal module 20 is connected to the printed substrate 17 by means of the holding members 11 of the housing 7, the connection terminal 23 formed on the printed substrate 17 and the convex electrode 22 on the COF 21 are securely in contact with each other and electrically connected.

According to Japanese Unexamined Patent Publication No. 9-22760/1997, there is a method for connecting a flexible printed circuit (FPC) to a printed substrate, in which a conductive spring protruding electrode, referred to as a contact, is provided on the printed substrate, and the FPC is snapped on the printed substrate with a connection terminal of FPC pressing onto the contact from above.

This method requires space for providing the conductive spring protruding electrode on the printed substrate, limiting the mounting area allocated for other components mounted on the printed substrate. This method also requires a process for mounting the conductive spring protruding electrode on the printed substrate in the printed substrate assembly process.

Further, in this structure, a liquid crystal module is placed on the printed substrate in an area except the snap-on section, or above the snap-on section after the FPC is snapped on the printed substrate.

However, in the former case, the liquid crystal module occupies a large area on the printed substrate, thus it is difficult to adopt the former case to an electronic device such as a cellular phone which requires to mount components in predetermined space. In the latter case, single-step mounting cannot be achieved, and the total thickness from the substrate surface to the display module surface is increased.

The connection structure of the present invention is characterized in that a conductive spring protruding electrode or an electrode of other structure is provided on a COF. Therefore, a printed substrate requires only a contact to be provided thereon for contacting the protruding electrode on the COF, and the contact can be formed during the printed substrate manufacturing process, without requiring an additional process.

In this structure, since only a contact is provided on the printed substrate, no limitations are set on the component mounting area on the printed substrate. Besides, this structure does not require a process for attaching a component having a protruding electrode on the printed substrate. Further, since the protruding electrode can be placed under the liquid crystal module, fixing of the liquid crystal module and connection between the liquid crystal module and the printed substrate can be simultaneously achieved by snapping the liquid crystal module on the printed substrate from above.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A connection structure for connecting a display module to a printed substrate, said display module including a display panel connected with a semiconductor device having a semiconductor chip mounted on a flexible wiring substrate, wherein:

said display module is fixed to a housing member in a folded state with respective rear surfaces of said semiconductor device and said display panel facing each other;

a three-sided frame that holds the display panel is formed on the housing member;

a protruding electrode is formed on said semiconductor device;

said display module is fixed to said printed substrate by means of a holding member attached to said housing member; said holding member supporting said printed substrate in engagement therewith; and said protruding electrode formed on said semiconductor device is in contact with a connection terminal provided on said printed substrate corresponding to said protruding electrode.

2. The connection structure for a display module and a printed substrate of claim 1, wherein:

said display panel is a liquid crystal panel.

3. The connection structure for a display module and a printed substrate of claim 1, wherein:

said semiconductor device is fixed to said housing member by inserting a protrusion formed on said housing member into a cut portion of said semiconductor device.

4. The connection structure for a display module and said printed substrate of claim 1, wherein:

said holding member attached to said housing member engages a rear surface of said printed substrate so as to join said printed substrate to said housing member.

5. A semiconductor device for use in a connection structure for connecting a display module to a printed substrate; said display module including a display panel connected with said semiconductor device having a semiconductor chip mounted on a flexible wiring substrate; wherein:

said display module is fixed to a housing member in a folded state with respective rear surfaces of said semiconductor device and said display panel facing each other;

a three-sided frame that holds the display panel is formed on the housing member;

a protruding electrode is formed on said semiconductor device;

said display module is fixed to said printed substrate by means of a holding member attached to said housing member, said holding member supporting said printed substrate in engagement therewith; and said protruding electrode formed on said semiconductor device is in contact with a connection terminal provided on said printed substrate corresponding to said protruding electrode.

6. The semiconductor device of claim 5, wherein:
said display panel is a liquid crystal panel.

7. The semiconductor device of claim 5, wherein:
said protruding electrode is a metal pin electrode terminal.

8. The semiconductor device of claim 5, wherein:
said protruding electrode is a metal spring electrode terminal.

9. The semiconductor device of claim 5, wherein:
a base substance of said flexible wiring substrate is made of a polyimide resin material with a thickness of 5 to 75 $\mu$m.

10. The semiconductor device of claim 6, wherein:
a base substance of said flexible wiring substrate is made of a polyimide resin material with a thickness of 5 to 75 $\mu$m.

11. The semiconductor device of claim 7, wherein:
a base substance of said flexible wiring substrate is made of a polyimide resin material with a thickness of 5 to 75 $\mu$m.

12. The semiconductor device of claim 8, wherein:
a base substance of said flexible wiring substrate is made of a polyimide resin material with a thickness of 5 to 75 $\mu$m.

13. A display module for use in a connection structure for connecting a display module to a printed substrate, said display module including a display panel connected with said semiconductor chip mounted on a flexible wiring substrate, wherein:

said display module is fixed to a housing member in a folded state with respective rear surfaces of said semiconductor device and said display panel facing each other;

a three-sided frame that holds the display panel is formed on the housing member;

a protruding electrode is formed on said semiconductor device;

said display module is fixed to said printed substrate by means of a holding member attached to said housing member, said holding member supporting said printed substrate in engagement therewith; and said protruding electrode formed on said semiconductor device is in contact with a connection terminal provided on said printed substrate corresponding to said protruding electrode.

14. The display module of claim 13, wherein:

said display panel is a liquid crystal panel.

15. An electronic component formed by connecting a display module with a printed substrate by means of a connection structure for connecting a display module to a printed substrate, said display module including a display panel connected with a semiconductor device having a semiconductor chip mounted on a flexible wiring substrate, said connection structure being arranged such that:

said display module is fixed to a housing member in a folded state with respective rear surfaces of said semiconductor device and said display panel facing each other;

a three-sided frame that holds the display panel is formed on the housing member;

a protruding electrode is formed on said semiconductor device;

said display module is fixed to said printed substrate by means of a holding member attached to said housing member, said holding member supporting said printed substrate in engagement therewith; and said protruding electrode formed on said semiconductor device is in contact with a connection terminal provided on said printed substrate corresponding to said protruding electrode.

16. The electronic component of claim 15, wherein:

said display panel is a liquid crystal panel.

17. A connection structure for connecting a display module to a printed substrate, said display module being formed by connecting a display panel with a semiconductor device, said connection structure comprising:

a protruding electrode provided on said semiconductor device so as to establish electrical connection with a substrate electrode formed on said printed substrate;

a housing member for holding said display module in a state where respective rear surfaces of said semiconductor device and said display panel face each other;

a three-sided frame that holds the display panel formed on the housing member; and a holding member attached to said housing member, for connecting said display module to said printed substrate, said holding member supporting said printed substrate in engagement therewith by holding a fringe portion of said printed substrate.

18. A display module which forms a connection structure with a printed substrate having a connection terminal, comprising:

a semiconductor device which includes a flexible wiring substrate, a semiconductor chip mounted on said flexible wiring substrate, and a protruding electrode which establishes electrical connection with said connection terminal of said printed substrate; and a display panel connected to said semiconductor device, wherein said display module is fixed to a housing member having attached thereto a holding member for fixing said printed substrate, in a folded state with respective rear surfaces of said semiconductor device and said display panel facing each other, and a three-sided frame that holds the display panel is formed on the housing member.

19. An electronic component comprising:

a printed substrate having a connection terminal;

a display module which includes a semiconductor device and a display panel, said semiconductor device including a flexible wiring substrate, a semiconductor chip mounted on the flexible wiring substrate, and a protruding electrode which establishes electrical connection with said connection terminal of said printed substrate; said display panel being connected to said semiconductor device;

a housing member for fixing said display module to said printed substrate by means of a holding member attached to said housing member, in a folded state with respective rear surfaces of said semiconductor device and said display panel facing each other, said holding member supporting said printed substrate in engagement therewith, and a three-sided frame that holds the display panel is formed on the housing member.

* * * * *